United States Patent
Nagulapalli et al.

(10) Patent No.: US 10,193,515 B2
(45) Date of Patent: Jan. 29, 2019

(54) CONTINUOUS TIME LINEAR EQUALIZER WITH TWO ADAPTIVE ZERO FREQUENCY LOCATIONS

(71) Applicant: INPHI CORPORATION, Santa Clara, CA (US)

(72) Inventors: Rajasekhar Nagulapalli, Northampton (GB); Simon Forey, Northamptonshire (GB); Parmanand Mishra, Cupertino, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 16/101,301

(22) Filed: Aug. 10, 2018

(65) Prior Publication Data

US 2018/0351524 A1    Dec. 6, 2018

Related U.S. Application Data

(63) Continuation of application No. 15/453,525, filed on Mar. 8, 2017, now Pat. No. 10,075,141.

(51) Int. Cl.
| | |
|---|---|
| *H03G 3/30* | (2006.01) |
| *H03F 3/45* | (2006.01) |
| *H03F 3/193* | (2006.01) |
| *H04L 25/03* | (2006.01) |

(52) U.S. Cl.
CPC ........... *H03G 3/3042* (2013.01); *H03F 3/193* (2013.01); *H03F 3/45179* (2013.01); *H04L 25/03012* (2013.01); *H04L 25/03878* (2013.01); *H03F 2203/45151* (2013.01); *H03F 2203/45156* (2013.01); *H04L 2025/03445* (2013.01); *H04L 2025/03535* (2013.01)

(58) Field of Classification Search
CPC .................................................... H03G 3/3042
See application file for complete search history.

(56) References Cited

U.S. PATENT DOCUMENTS

| | | | | |
|---|---|---|---|---|
| 5,304,946 A * | 4/1994 | Sano | ........................ | H03G 3/18 330/254 |
| 8,395,446 B1 * | 3/2013 | Tran | ................. | H03K 19/01837 330/254 |
| 2002/0050861 A1 * | 5/2002 | Nguyen | ................ | H03F 1/3211 330/254 |
| 2004/0258183 A1 * | 12/2004 | Popescu | ................. | H03H 15/00 375/350 |
| 2013/0114663 A1 * | 5/2013 | Ding | ................. | H04L 25/03038 375/230 |
| 2014/0191804 A1 * | 7/2014 | Kitamura | ................ | H03F 3/193 330/282 |
| 2018/0083584 A1 * | 3/2018 | Yuan | ................... | H03F 3/45179 |

\* cited by examiner

*Primary Examiner* — Patricia T Nguyen
(74) *Attorney, Agent, or Firm* — Richard T. Ogawa; Ogawa P.C.

(57) ABSTRACT

The present invention is directed to electrical circuits. More specifically, embodiments of the presentation provide a CTLE module that includes a two compensation sections. A high-frequency zero RC section is in the source of the differential pair and close to the bias current source. A low-frequency zero section is coupled to an output terminal and configured outside the input signal path. A DC gain tuning section is coupled to the low-frequency zero section. There are other embodiments as well.

20 Claims, 9 Drawing Sheets

CONTINUOUS TIME LINEAR EQUALIZER WITH TWO ADAPTIVE ZERO FREQUENCY LOCATIONS

CROSS-REFERENCES TO RELATED APPLICATIONS

This application is continuation of and claims priority to U.S. patent application Ser. No. 15/453,525, filed on Mar. 8, 2017, commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to electrical circuits.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. In communication applications, continuous time linear equalizers (CTLE) are often used to improve signal integrity.

Over the past, there have been various types of conventional CTLE devices, but unfortunately they have been inadequate. It is thus desirable to have new and improved CTEL devices.

BRIEF SUMMARY OF THE INVENTION

The present invention is directed to electrical circuits. More specifically, embodiments of the presentation provide a CTLE module that includes a two compensation sections. A high-frequency zero RC section is in the source of the differential pair and close to the bias current source. A low-frequency zero section is coupled to an output terminal and configured outside the input signal path. A DC gain tuning section is coupled to the low-frequency zero section. There are other embodiments as well.

According to an embodiment, the present invention provides a continuous-time linear equalizer device, which has a first input terminal and a second input terminal. The device also includes a first input transistor comprising a first gate terminal a first drain terminal and a first source terminal. The first gate terminal is coupled to the first input signal. The device also includes a second input transistor comprising a second gate terminal a second drain terminal and a second source terminal. The second gate terminal is coupled to the second input signal. The device further includes a first source resistor coupled to the first source terminal. The device has a first source capacitor coupled to the first source terminal. The device includes a first compensation circuit coupled to the first drain terminal. The first compensation circuit includes a first load capacitor and a first load resistor. The first load capacitor and the first load resistor are associated with a predetermined low-frequency zero. The device has a first gain tuning circuit coupled to the first compensation circuit.

According to another embodiment, the present invention provides a continuous-time linear equalizer device that has a first input terminal and a second input terminal. The device includes a first input transistor comprising a first gate terminal a first drain terminal and a first source terminal. The first gate terminal is coupled to the first input signal. The device also includes a second input transistor comprising a second gate terminal a second drain terminal and a second source terminal. The second gate terminal is coupled to the second input signal. The device further includes a first source resistor coupled to the first source terminal. The device includes a first source capacitor coupled to the first source terminal. The device further includes a first compensation circuit coupled to the first drain terminal. The first compensation circuit has a first load capacitor and a first load resistor. The first load capacitor and the first load resistor are associated with a predetermined low-frequency zero.

According to yet another embodiment, the present invention provides a continuous-time linear equalizer device. The device includes a first input transistor comprising a first gate terminal a first drain terminal and a first source terminal. The first gate terminal is coupled to a first input signal. The device also includes a second input transistor comprising a second gate terminal a second drain terminal and a second source terminal. The second gate terminal is coupled to a second input signal. The device further includes a first source resistor coupled to the first source terminal. The device also includes a first source capacitor coupled to the first source terminal. The device additionally includes a first compensation circuit coupled to the first drain terminal. The first compensation circuit has a first load capacitor and a first load resistor. The first load capacitor and the first load resistor are associated with a predetermined low-frequency zero. The device also includes a second compensation circuit coupled to the second source terminal.

It is to be appreciated that embodiments of the present invention provide many advantages over conventional techniques. Among other things, CLTE modules according to embodiments of the present invention provide equalization at both high (e.g., gigahertz) and low (e.g., megahertz) range. Additionally, circuits for providing low-frequency zeroes are configured outside signal path and thus have minimal impact signals and performance. Furthermore, frequencies associated with both high-frequency zero and low-frequency zero are both adjustable. For example, used in serial communication applications, CTLE modules according to the present invention can reduce the amount of inter symbol interference.

Embodiments of the present invention can be implemented in conjunction with existing systems and processes. More specifically, embodiments of the present invention can be implemented using existing hardware and manufacturing processes with minimal modifications. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to electrical circuits. More specifically, embodiments of the presentation provide a CTLE module that includes a two compensation sections. A high-frequency zero RC section is in the source of the differential pair and close to the bias current source. A low-frequency zero section is coupled to an output terminal and configured outside the input signal path. A DC gain tuning section is coupled to the low-frequency zero section. There are other embodiments as well.

Figure 1:
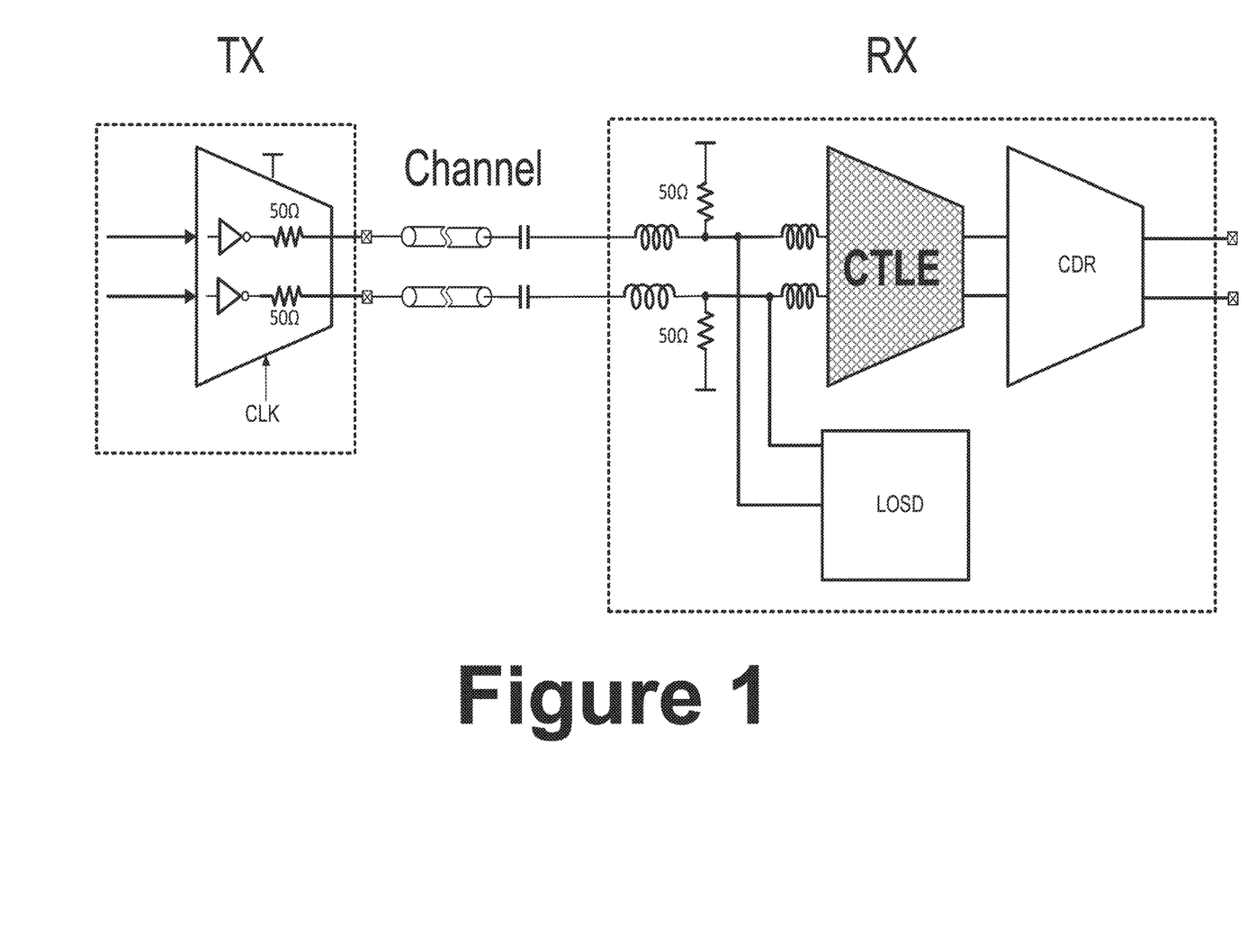
FIG. 1 is a simplified diagram illustrating a CTLE used in a communication system.

As explained above, CTLEs have a wide range of applications. For example, CTLEs are widely used in data communication systems. FIG. 1 is a simplified diagram illustrating a CTLE used as a frontend amplifier in a communication system according to an embodiment of the present invention. This diagram is merely an example, which should not unduly limit the scope of the claims. One of ordinary skill in the art would recognize many variations, alternatives, and modifications. More specifically, CTLE module is implemented as a part of the receiving entity RX. Input signals are equalized by the CTLE before further processing. For example, loss of signal detection (LOSD) module determines whether there is signal being received. Once it is determined that there are signal coming from the transmitting entity (TX), equalization is performed by the CTLE module. For example, the CTLE module is used a component of an analog front end portion of the communication device. After equalization by the CTLE module, signal processing such as clock data recovery (CDR), analog to digital conversion (ADC), and/or other processes are then performed.

Figure 2:
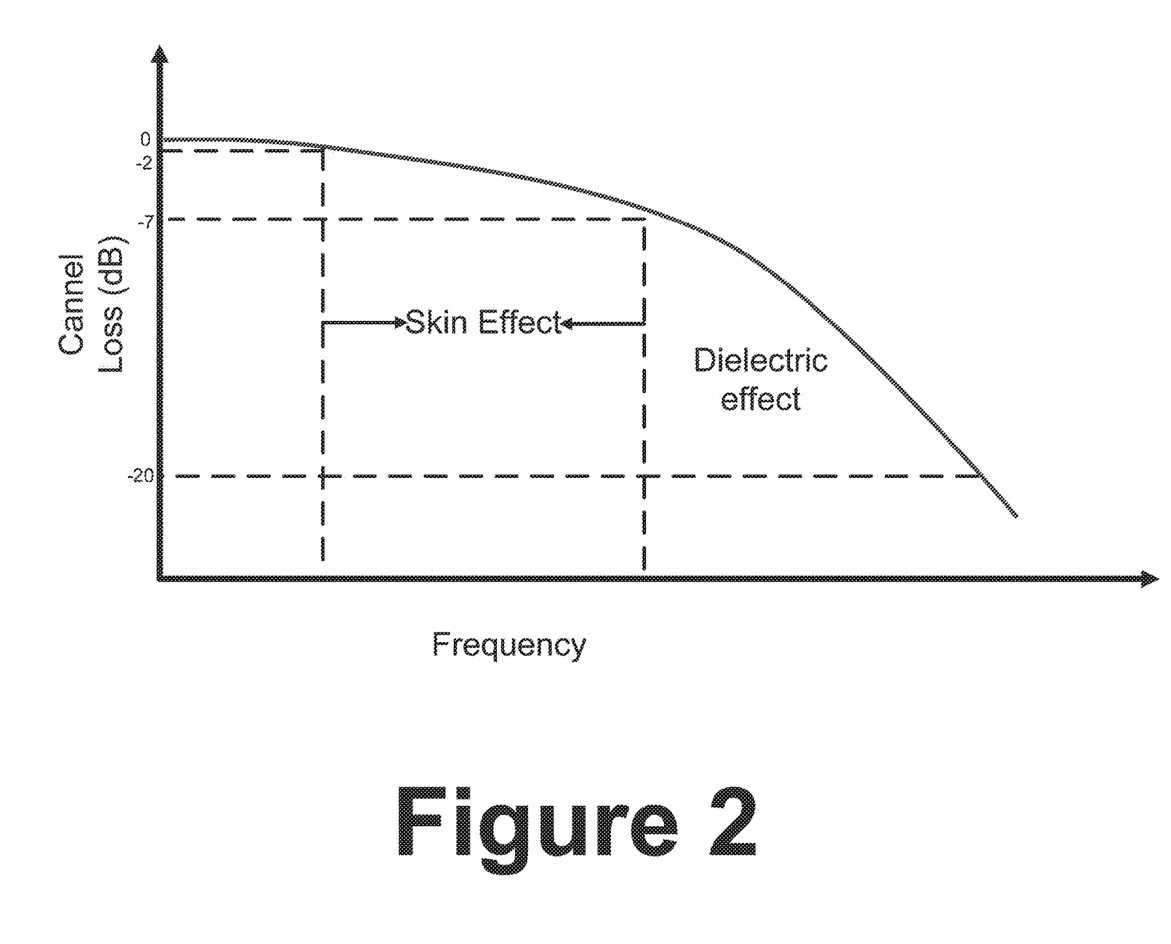
FIG. 2 is a simplified graph illustrating channel loss.

One important purpose of CTLE is to equalized the incoming data for processing. Ideally, incoming signal at different frequencies and gain levels are equalized. Among other things, CTLE would compensate for channel losses that typically occur during data transmission. FIG. 2 is a simplified graph illustrating channel loss. As can be seen in FIG. 2, there is channel loss at both high frequency levels and low frequency levels. Typically, serial communication channels exhibit channel loss due to skin effect and dielectric effects. More specifically, skin effect dominates at low frequency (few MHz) and dielectric effect dominates at high frequencies (up to Nyquist Frequency). As frequency level increases, dielectric effect becomes more and more prominent (reaching −20 dB in FIG. 2). In contrast, skin effect dominated region typically have a gentle slope (e.g., 3-4 dB/dec) where:

$$\text{Channel Loss(dB)} = \frac{K_{Skin}}{\sqrt{f}} + \frac{K_{Die}}{f}$$

Figure 3:
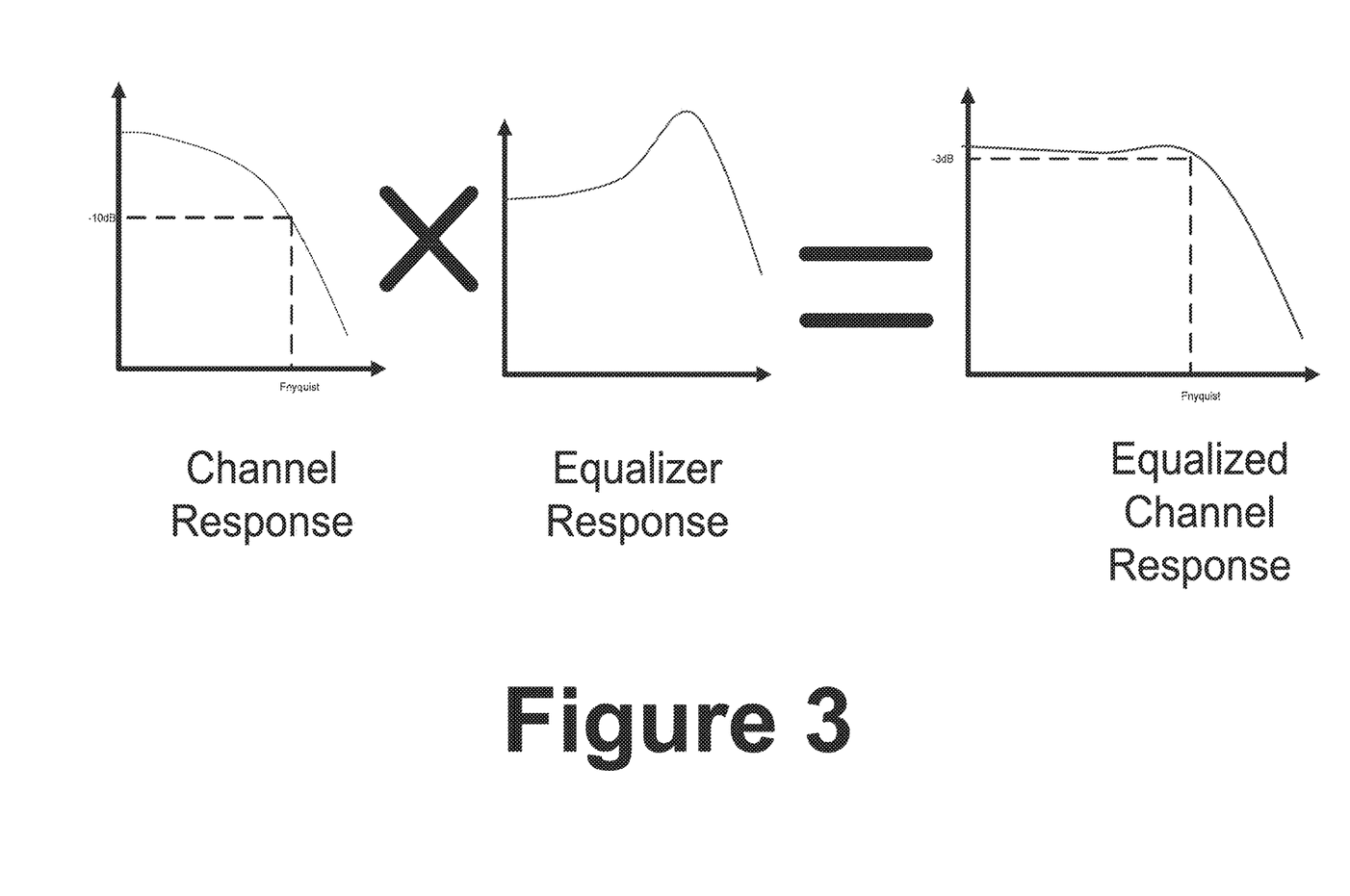
FIG. 3 provides graphs illustrating effects of equalization.

CTLE modules can effectively compensate channel loss. FIG. 3 provides graphs illustrating effects of equalization. The left graph illustrates channel response with effect of channel loss. More specifically, at the Nyquist frequency $F_{Nyquist}$, the signal strength has a sharp drop at about 10 dB. The CTLE module is configured to compensate for channel loss. The middle graph illustrates the equalizer (i.e., CTLE module) response, which is essentially flat and has a peak at the Nyquist frequency. The equalized channel response, illustrated by the graph on the right, shows that the signal strength is substantially flat (i.e., around −3 dB) up to the Nyquist frequency $F_{Nyquist}$. The channel loss and its nonlinearity have adverse effects to the data signals. Among other features, frequency-dependent channel loss introduces intersymbol interference (ISI), which compromises link margin. The CTLE module in a way has a high-pass characteristic up to the Nyquist frequency (close to inverse characteristics of channel). To cancel loss due to skin effect, CTLE modules need to provide equalization at low frequency range (e.g., in megahertz range) and to cancel the loss due to dielectric effect, CTLE circuit need to provide equalization at high frequency range (e.g., in gigahertz range). In various embodiments, CTLE modules provide a low frequency pole zero pair in the megahertz frequency range and few dB's gain. To compensate for the die-electric effect loss, CTLE modules also provide a high frequency zero in the order of few gigahertz frequency range.

Figure 4:
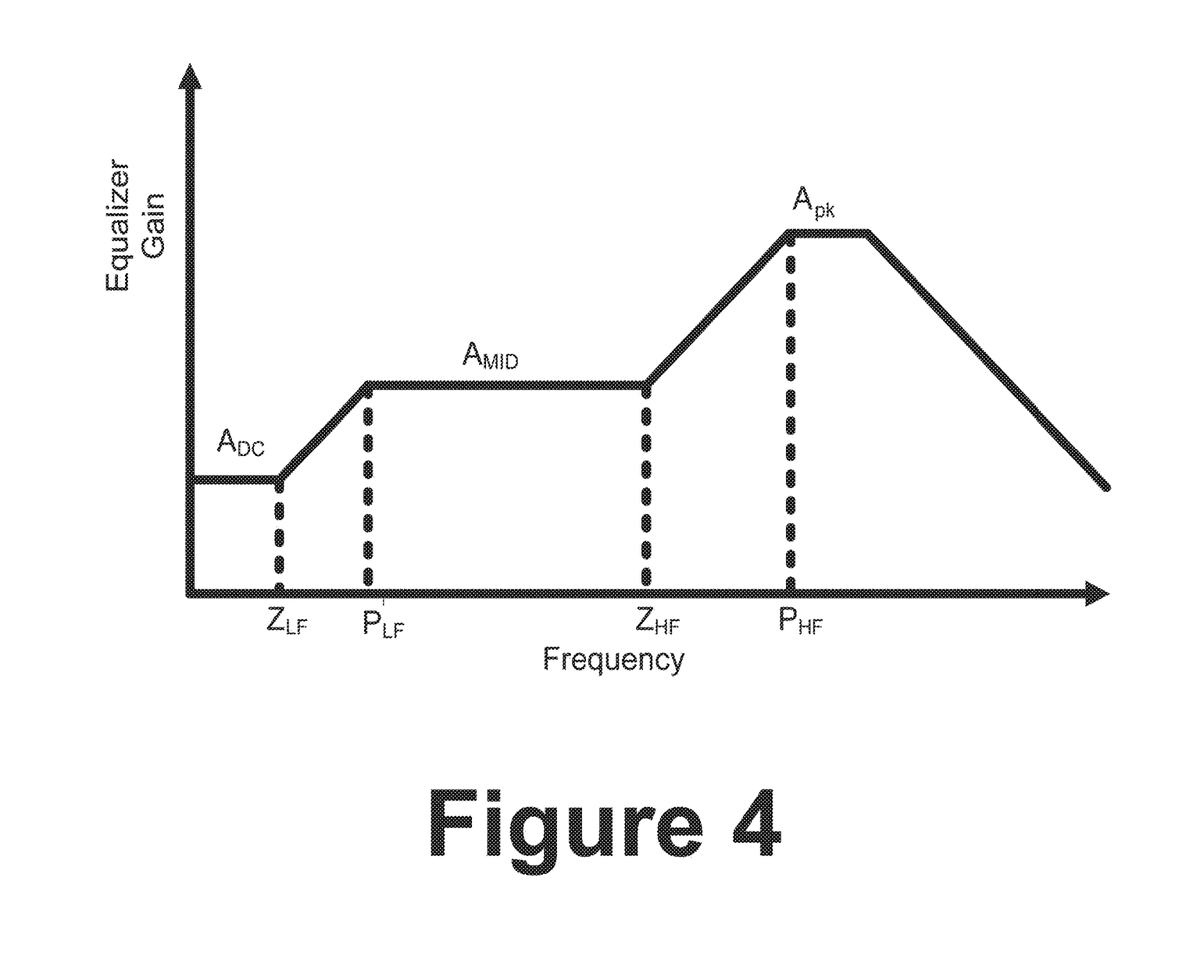
FIG. 4 is a graph illustrating equalizer gains at various frequencies.

FIG. 4 is a graph illustrating equalizer gains at various frequencies. This diagram is merely an example, which should not unduly limit the scope of the claims. One of ordinary skill in the art would recognize many variations, alternatives, and modifications. Up to low zero frequency $Z_{LF}$, the low frequency gain is at ADC as shown. From low-zero frequency to low pole frequency $P_{LF}$, the gain ramps up to mid frequency gain $A_{Mid}$, and the gain stays at $A_{Mid}$ until high zero frequency $Z_{HF}$ is reached. From high zero frequency $Z_{HF}$, the gain ramps to peak gain level $A_{pk}$ at high pole frequency $P_{HF}$. From $P_{HF}$ to a higher frequency, the gain stays at $A_{pk}$ then starts decreasing at higher frequency levels. As explained above, CTLE modules according to embodiments of the present invention provide low frequency zero (i.e., $Z_{LF}$) and high frequency zero (i.e., $Z_{HF}$) to compensate channel loss as illustrated in FIG. 4. At the same time, to support multiple channels (with different frequency characteristics), characteristics of CTLE modules (low frequency gain and high frequency) need to adaptively change without affecting other parameters.

Figure 5:
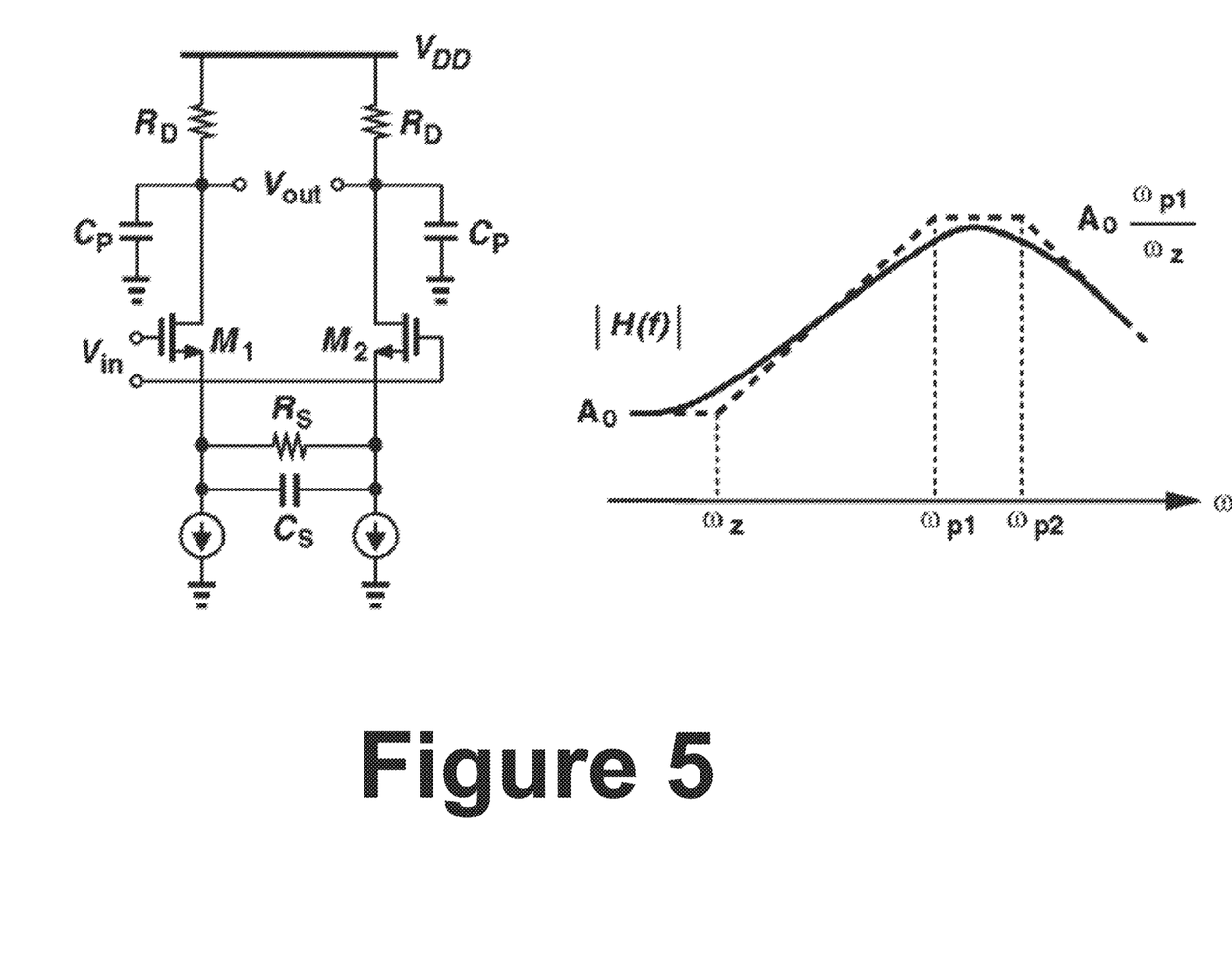
FIG. 5 is a simplified diagram illustrating a conventional CTLE.

FIG. 5 is a simplified diagram illustrating a conventional CTLE. Differential inputs are received by transistors $M_1$ and $M_2$. The source terminals of transistors $M_1$ and $M_2$ are coupled to the source resistor $R_s$ and the source capacitor $C_s$. The source resistor $R_s$ and the source capacitor $C_s$ are configured in parallel relative to each other. Together, $R_S$ and $C_S$ provide a gain boost at high frequency level H(f) by changing the low frequency zero location and DC gain, as illustrated in the graph on the right. For the conventional implementation illustrated in FIG. 5, there is a trade-off between the low-frequency gain and boost factor. With single zero-pole doublet, it provides no compensation for low-frequency skin-effect loss. Additionally, DC gain and zero frequency are coupled.

Figure 6:
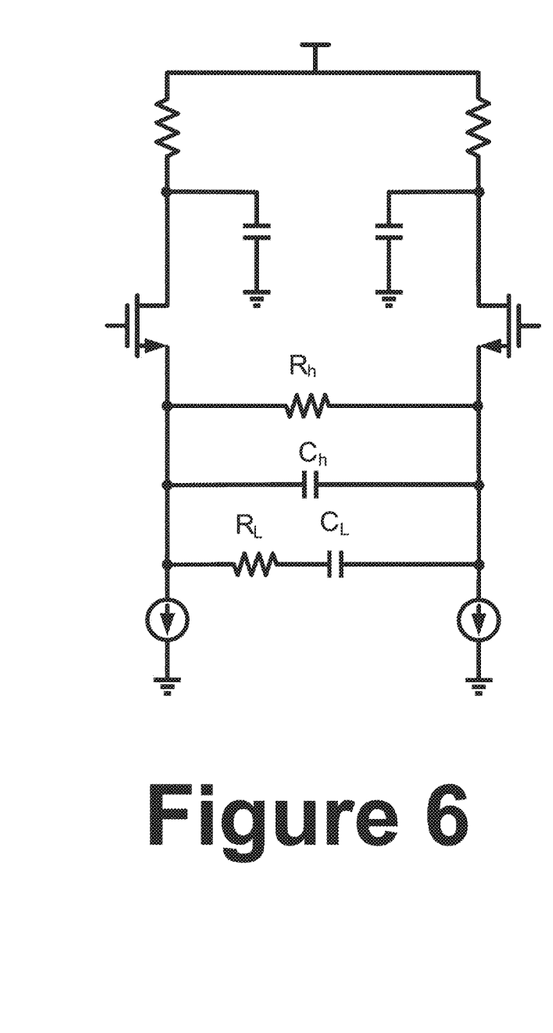
FIG. 6 is a simplified diagram illustrating a conventional CTLE.

FIG. 6 is a simplified diagram illustrating a conventional CTLE. Differential inputs are received by transistors. The source terminals of the input transistors are coupled to resistor and capacitor elements that provide gain compensation. More specifically, resistor $R_h$ and capacitor $C_h$, which are configured in parallel relative to each other, provide high frequency compensation. The resistor $R_L$ and capacitor $C_L$, which are configured in series relative to each other, provide low frequency compensation. There are various drawbacks with this implementation as well. Low frequency skin effect loss has been compensated with passive series RC, hence no additional power. To create low frequency zero the pair $R_L$ and $C_L$ needs to be placed around megahertz frequency range. This means that $R_L$ needs to be configured in the order of load resistor (i.e., resistors coupled to the drain terminals of the input transistors) size, or otherwise low frequency gain would be very low. As a result, the series capacitor $C_L$ needs to be very high (order of 100 pF). The large size of $C_L$ adds huge parasitic effect on the Hf node and common mode gain peaking would increase, assuming that high value (100 pF) can be actually implemented in the actual circuit. For example, for a low frequency zero location to be at 5 MHz and resistor ($R_H$) at around 1 kΩ (i.e., makes dc below −10 dB), required capacitance for $C_L$ would be around 80 pF.

It is thus to be appreciated that embodiments of the present invention provide both high frequency zero and low frequency zero without requiring large device area and introducing large undesirable side effects.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 7:
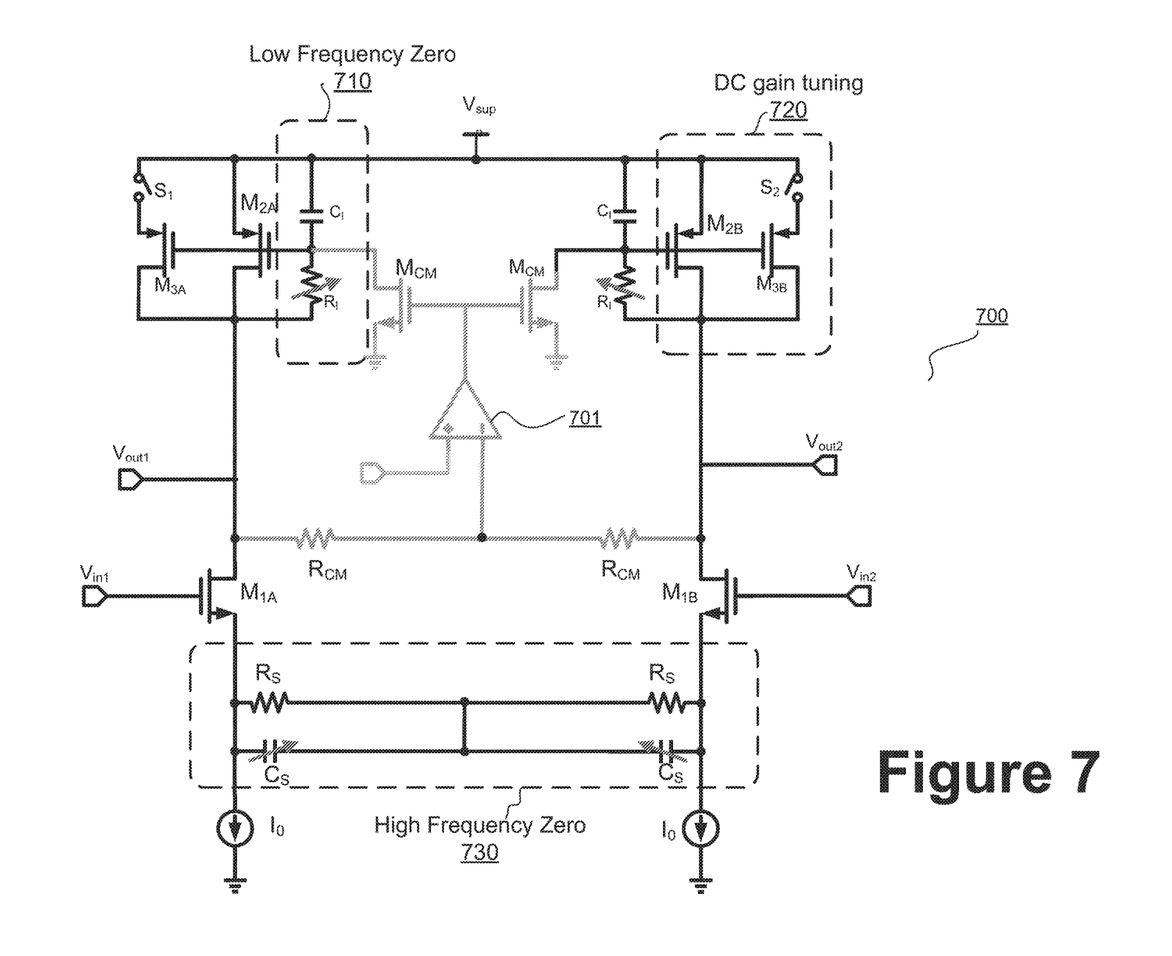
FIG. 7 is a simplified diagram illustrating a CTLE module 700 according to embodiments of the present invention.

FIG. 7 is a simplified diagram illustrating a CTLE module 700 according to embodiments of the present invention. This diagram is merely an example, which should not unduly limit the scope of the claims. One of ordinary skill in the art would recognize many variations, alternatives, and modifications. Differential input signals $V_{in1}$ and $V_{in2}$ are coupled to gate terminals of transistors $M_{1A}$ and $M_{1B}$. For the purpose of illustration, NMOS transistors are used, but it is to be appreciated that other types of transistors can be used as well. The source terminals of transistors $M_{1A}$ and $M_{1B}$ are coupled to a high frequency zero circuit 730. The high frequency zero circuit 730 includes a pair of source resistors $R_S$ and pair of source capacitors $C_S$ as shown. For example, source resistors $R_S$ are matched; source capacitors $C_S$ are matched. The high frequency zero circuit provides a high frequency boost, as discussed above, at high frequency levels. For example, the high frequency zero provides a boost at gigahertz range. Depending on the implementation, the configuration and size of source resistors and source capacitors may be modified. In various embodiments, variable resistors and/or variable capacitors are used to provide zero frequency adjustability. The high frequency zero circuit is coupled to a pair of bias current sources (i.e., $I_0$). It is to be noted that for high frequency zeroes, source resistors and source capacitors are relative small in both size and value.

The drain terminals of the input transistors are coupled to supply voltage. Additionally, at drain terminals side of the transistors $M_{1A}$ and $M_{1B}$, CTLE module 700 also includes low frequency zero circuit 710 and DC gain tuning circuit 720. It is to be noted that circuits 710 and 720 are configured in pairs. That is, the source terminal of transistor $M_{1A}$ is coupled to both a DC tuning circuit and a low frequency zero circuit. Similarly, the source terminal of transistor $M_{2A}$ is coupled to another set of DC tuning circuit and low frequency zero circuit. In various embodiments, various components are of corresponding circuits are matched. For example, $R_1$ and $C_1$ at circuit at circuit 710 on the left side matches the $R_1$ and $C_1$ on the right side. Similarly, transistors $M_{2A}$ and $M_{2B}$ are matched as well.

The drain terminals for transistors $M_{1A}$ and $M_{1B}$ are respectively coupled output terminals $V_{out1}$ and $V_{out2}$. For example, $V_{out1}$ and $V_{out2}$ are a pair of differential output signals. It is to be noted that circuits 710 and 720 are both at the output (drain) sides of the input transistors $M_{1A}$ and $M_{1B}$.

Resistors $R_1$ and capacitors $C_1$ provide low-frequency zero (e.g., operating in megahertz range) for the CTLE module 700. For example, resistor $R_1$ and capacitor $C_1$ of circuit 710 are configured in series. The $R_1C_1$ is specifically tuned to match frequency for the low-frequency zero. For example, by making resistor $R_1$ large, the size of capacitor $C_1$ can be made small. It is also to be appreciated that since resistors $R_1$ and capacitors $C_1$ are configured outside the signal path, they have limited negative impact on signal quality and performance. As mentioned above, resistors $R_1$ and capacitors $C_1$ are both at the output side of the input transistors, which means that they are isolated from the input signals. For example, active inductor gate terminals of transistors $M_{3A}$ and $M_{3B}$ are connected to $R_1C_1$ series network, which contribute to DC gain as well forms low frequency pole zero to compensate the skin effect. In various embodiments, the low-frequency zero can be adjusted by changing $R_1$ value without affecting other parameters. In a specific embodiment, resistor $R_1$ is implemented using a variable resistor to allow for adjustment. It is also to be appreciated that compared to configured low-frequency zero resistors $R_1$ and capacitors $C_1$ at the source terminals of the input transistors (e.g., as shown in FIG. 6), the power consumption attributed to $R_1$ and $C_1$ is minimized.

In addition low frequency circuit zero circuits and DC gain tuning circuits, drain terminals of transistors $M_{1A}$ and $M_{1B}$ are coupled to common mode resistors $R_{CM}$ as shown. An operational amplifier (op-amp) 701 is coupled to the common mode resistors as shown. The voltage between the two common mode resistors $R_{CM}$ is used as the negative input for op-amp 701. In various embodiments, a bias voltage (e.g., tail bias point) is coupled to the positive input of op-amp 701. The output of op-amp 701 is coupled to gate terminals of common mode transistors $M_{CM}$, both on the right and left side. Source terminals of common mode transistor $M_{CM}$ as shown are grounded, while the output drain terminals are coupled to the low frequency zero circuit and the DC gain tuning circuit. For example, gate bias of active inductor transistors ($M_{2A}$ and $M_{2B}$) are derived from common mode feedback through common mode resistors $R_{CM}$ and common mode transistors $M_{CM}$, and op-amp 701. In various implementations, DC gain cane be adjusted by changing transistors $M_{2A}$ and/or $M_{2B}$ without affecting other parameters.

Additionally, the output signals at source terminals of the common mode transistors $M_{CM}$ are used as bias signals coupled to the gate terminals of transistors $M_{2A}$ and $M_{2B}$.

In certain embodiments, a control logic (not shown in FIG. 7) is coupled to the CTLE module 700 to provide control signals. For example, switches $S_1$ and $S_2$, which are used for DC gain tuning and controlled by the control logic. As shown in FIG. 7, switches $S_1$ and $S_2$ are couple to supply voltage $V_{supp}$ and transistors $M_{3A}$ and $M_{3B}$. For example, transistors $M_{3A}$ and $M_{3B}$ are implemented using NMOS transistors. By controlling switches $S_1$ and $S_2$, DC gain can be adjusted. By controlling $R_1$, the low-frequency zero frequency can be controlled.

Figure 8:
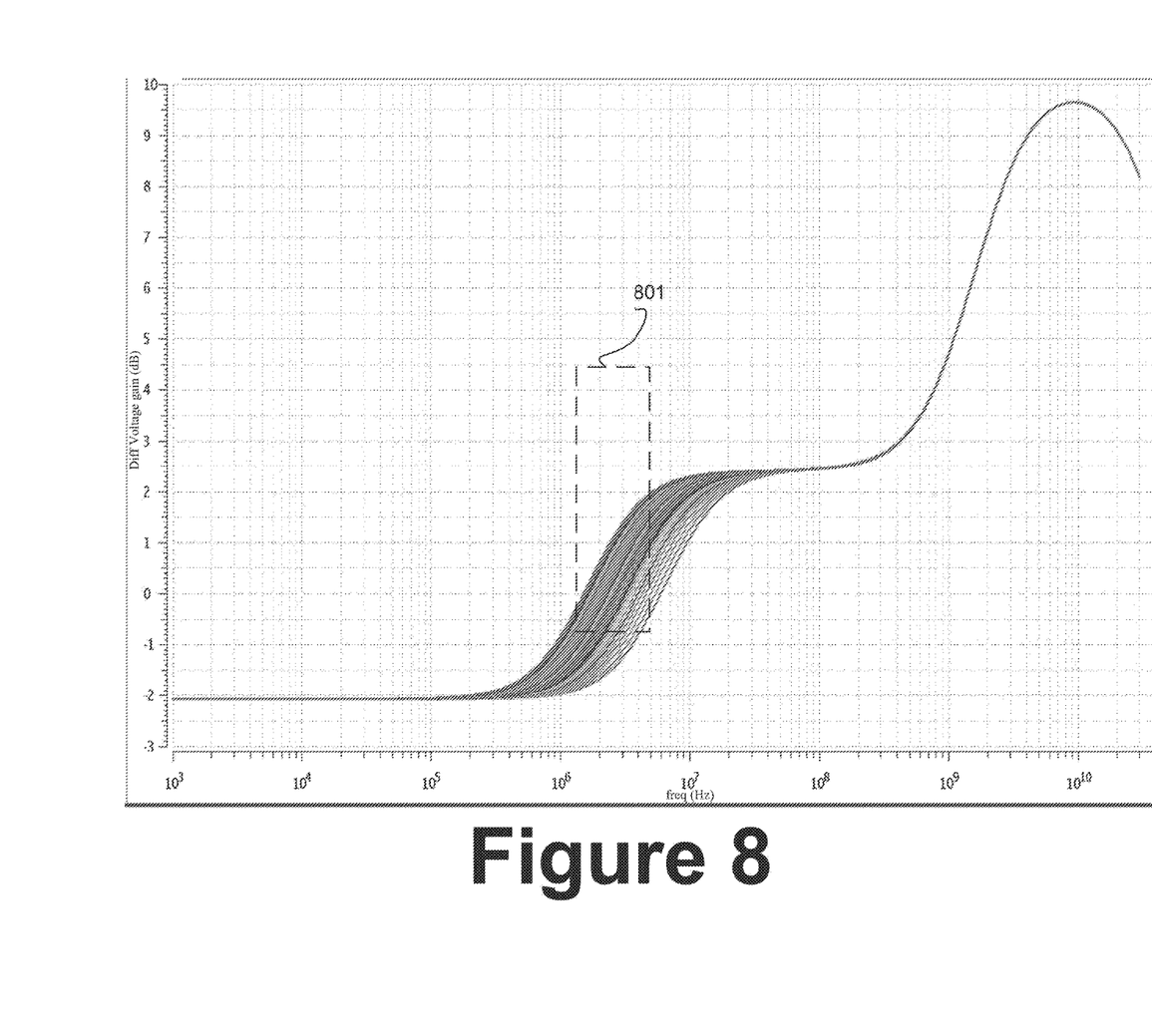
FIG. 8 is a simplified graph illustrating low-frequency programmability of a CTLE module according to embodiments of the present invention.

FIG. 8 is a simplified graph illustrating low-frequency programmability of a CTLE module according to embodiments of the present invention. For example, at region 801 (roughly around 1~5 MHz or $10^6$ on the graph), the differential voltage gain can be adjusted using the low-frequency zero circuits (e.g., $R_1$ and $C_1$) as shown in FIG. 7. More specifically, at the low-frequency zero range around 1~5 MHz, the low-frequency zero can provide up to 3 dB differential voltage gain. Resistor $R_1$ and capacitor $C_1$ along with $M_{2A}$ forms an active inductor.

Figure 9:
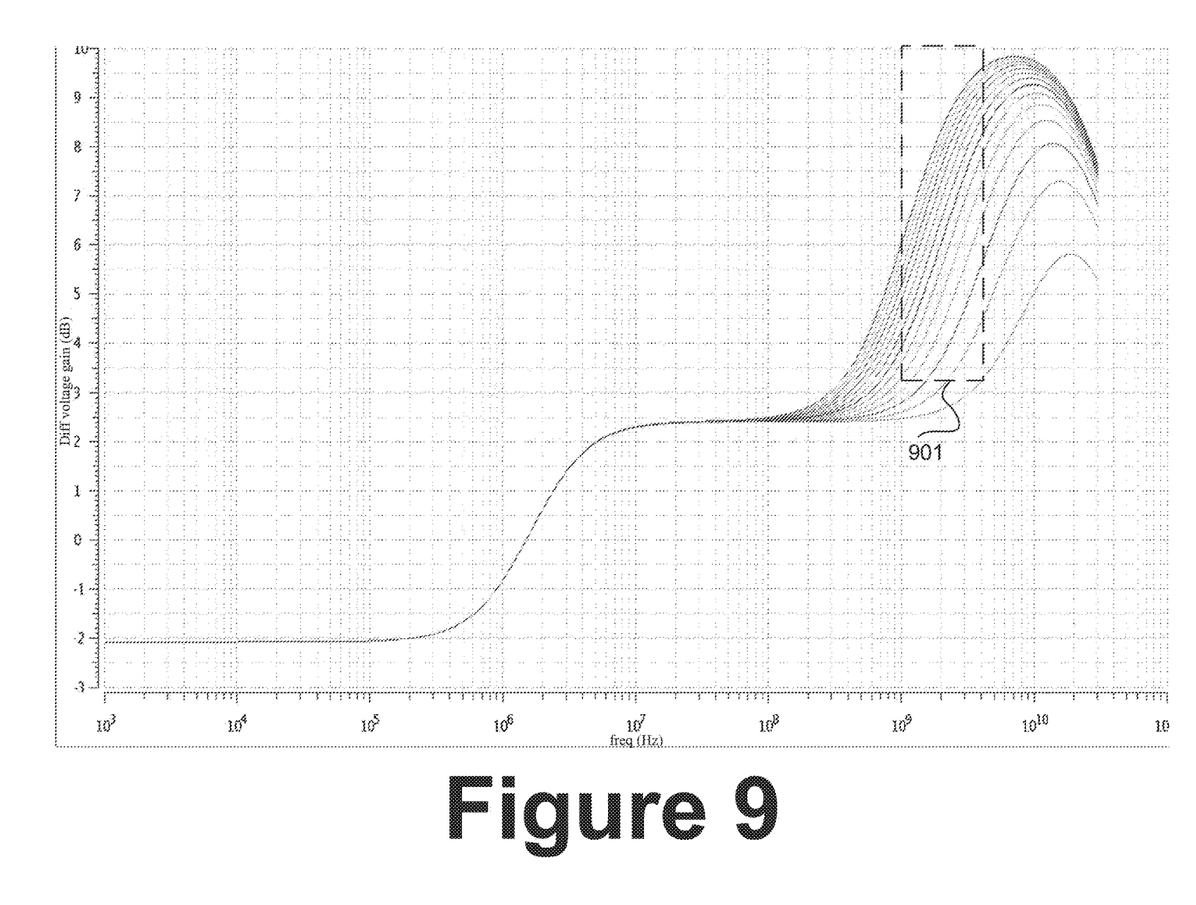
FIG. 9 is as simplified graph illustrating low-frequency peak tuning of a CTLE module according to embodiments of the present invention.

FIG. 9 is as simplified graph illustrating low-frequency peak tuning of a CTLE module according to embodiments of the present invention. For example, at region 901 (roughly around 1~5 GHz or $10^9$ Hz on the graph), the differential voltage gain can be adjusted using the high-frequency zero resistors and capacitors (e.g., $R_S$ and $C_S$ as shown in FIG. 7). More specifically, at the high-frequency zero range around 1~5 GHz, the low-frequency zero can provide up to 5 dB differential voltage gain.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A linear equalizer device comprising:
    a first input transistor comprising a first gate terminal a first drain terminal and a first source terminal, the first gate terminal being configured to receive a first input signal;
    a second input transistor comprising a second gate terminal a second drain terminal and a second source terminal, the second gate terminal being configured to receive a second input signal;
    a first compensation circuit coupled to the first drain terminal; and
    a high-frequency zero circuit comprising at least a pair of source resistors and a pair of source capacitors;
    wherein:
        the pair of source resistors comprises a first source resistor coupled to the first source terminal and a second source resistor coupled to the first source resistor and the second source terminal, a first terminal being positioned between the first source resistor and the second source resistor;
        the pair of source capacitors comprises a first source capacitor coupled to the first source terminal and a second source capacitor coupled to the second source terminal, a second terminal being positioned between the first source capacitor and the second source capacitor and coupled to the first terminal.

2. The device of claim 1 wherein the first input signal and the second input signal are a pair of differential input signals.

3. The device of claim 1 wherein the first source resistor and the first source capacitor are configured in parallel.

4. The device of claim 1 further comprising a bias current source coupled to the first source terminal.

5. The device of claim 1 wherein the first resistor comprises a variable resistor.

6. The device of claim 1 wherein the first resistor and the first capacitor are associated with a predetermined high-frequency zero.

7. The device of claim 1 further comprising a first gain tuning circuit coupled to the first compensation circuit, the first gain turning circuit comprising a first switch, the first switch being coupled to a control logic.

8. The device of claim 1 further comprising a pair of common mode resistors coupled to the first drain terminal.

9. The device of claim 1 wherein the first input transistor comprises an NMOS transistor.

10. The device of claim 1 wherein the first capacitor comprises a variable capacitor.

11. The device of claim 1 wherein the first compensation circuit comprises a first load capacitor and a first load resistor, the first load capacitor and the first load resistor being associated with a predetermined low-frequency zero.

12. The device of claim 1 wherein the first load resistor comprises a variable resistor.

13. The device of claim 12 further comprising:
a second compensation circuit coupled to the second drain terminal, the second compensation circuit comprising a second load capacitor and a second load resistor, the second load capacitor and the second load resistor being associated with the predetermined low-frequency zero;
a second gain tuning circuit coupled to the second compensation circuit.

14. The device of claim 13 further comprising:
a first common mode resistor coupled to the first drain terminal;
a second common mode resistor coupled to the second drain terminal, the second common mode resistor being characterized by a resistance value matching the first common mode resistor;
an operational amplifier coupled to the first common mode resistor and the second common mode resistor.

15. The device of claim 14 further comprising:
a first common transistor comprising a third gate terminal and a third source terminal and a third drain terminal, the third gate terminal being coupled to an output of the operation amplifier, the third terminal being coupled to the first compensation circuit;
a second common transistor comprising a fourth gate terminal and a fourth source terminal and a fourth drain terminal, the fourth gate terminal being coupled to the output of the operational amplifier.

16. The device of claim 15 further comprising a supply voltage coupled to the first load capacitor.

17. A receiver apparatus comprising:
a first input terminal;
a second input terminal;
a lost-of-signal detection circuit coupled to the first input terminal and the second input terminal; and
an equalizer circuit comprising:
a first input transistor comprising a first gate terminal a first drain terminal and a first source terminal, the first gate terminal being coupled to the first input signal;
a second input transistor comprising a second gate terminal a second drain terminal and a second source terminal, the second gate terminal being coupled to the second input signal;
a first source resistor coupled to the first source terminal;
a second source resistor coupled to the first source resistor and the second source terminal;
a first terminal positioned between the first source resistor and the second source resistor;
a first source capacitor coupled to the first source terminal;
a second source capacitor coupled to the second source terminal;
a second terminal positioned between the first source capacitor and the second source capacitor and coupled to the first terminal.

18. The apparatus of claim 17 further comprising:
a first compensation circuit coupled to the first drain terminal;
a second compensation circuit coupled to the second drain terminal;
a first gain tuning circuit coupled to the first compensation circuit;
a second gain tuning circuit coupled to the second compensation circuit;
a common mode operational amplifier coupled to the second compensation circuit.

19. A continuous-time linear equalizer device comprising:
a first input transistor comprising a first gate terminal a first drain terminal and a first source terminal, the first gate terminal being configured to receive a first input signal;
a second input transistor comprising a second gate terminal a second drain terminal and a second source terminal, the second gate terminal being configured to receive a second input signal;
a first common mode resistor coupled to the first drain terminal;
a high-frequency zero circuit comprising at least a pair of source resistors and a pair of source capacitors;
wherein:
the pair of source resistors comprises a first source resistor coupled to the first source terminal and a second source resistor coupled to the first source resistor and the second source terminal, a first terminal being positioned between the first source resistor and the second source resistor;
the pair of source capacitors comprises a first source capacitor coupled to the first source terminal and a second source capacitor coupled to the second source terminal, a second terminal being positioned between the first source capacitor and the second source capacitor and coupled to the first terminal.

20. The device of claim 19 further comprising:
a second common mode resistor coupled to the second drain terminal;
a common mode operational amplifier coupled to the first common resistor and the second common mode resistor.

* * * * *